(12) United States Patent
Heo et al.

(10) Patent No.: US 9,791,788 B2
(45) Date of Patent: Oct. 17, 2017

(54) METHOD OF MANUFACTURING A SEMICONDUCTOR DEVICE

(71) Applicant: Samsung Electronics Co., Ltd., Suwon-si (KR)

(72) Inventors: Jin-seok Heo, Suwon-si (KR); In-sung Kim, Seonggnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 37 days.

(21) Appl. No.: 15/060,625

(22) Filed: Mar. 4, 2016

(65) Prior Publication Data

US 2016/0268176 A1   Sep. 15, 2016

(30) Foreign Application Priority Data

Mar. 11, 2015 (KR) ........................ 10-2015-0034041

(51) Int. Cl.
  *G03F 7/20* (2006.01)
  *H01L 21/66* (2006.01)
  *H01L 21/027* (2006.01)

(52) U.S. Cl.
  CPC ...... *G03F 7/70608* (2013.01); *G03F 7/70575* (2013.01); *G03F 7/70616* (2013.01); *H01L 22/20* (2013.01); *H01L 21/0274* (2013.01); *H01L 22/12* (2013.01)

(58) Field of Classification Search
  CPC ............ G03F 7/70608; G03F 7/70575; G03F 7/70616; H01L 22/20
  USPC .................................................. 430/30, 394
  See application file for complete search history.

(56) References Cited

U.S. PATENT DOCUMENTS

| | | | |
|---|---|---|---|
| 6,894,285 B2 | 5/2005 | Kleinschmidt et al. | |
| 7,773,196 B2 | 8/2010 | Katsuhiko et al. | |
| 7,812,928 B2 | 10/2010 | Shiraishi | |
| 7,875,865 B2 | 1/2011 | Scholz et al. | |
| 8,338,063 B2 | 12/2012 | Heo et al. | |
| 8,492,058 B2 | 7/2013 | Heo et al. | |
| 8,576,373 B2 | 11/2013 | Botma et al. | |
| 8,715,911 B2 * | 5/2014 | Kim | G03F 7/095 430/270.1 |
| 8,895,226 B2 * | 11/2014 | Kim | G03F 7/095 430/270.1 |
| 2009/0250637 A1 | 10/2009 | Akins et al. | |
| 2013/0114081 A1 | 5/2013 | Fukazawa | |

FOREIGN PATENT DOCUMENTS

| | | |
|---|---|---|
| JP | 2006-173365 | 6/2006 |
| JP | 2012-234883 | 11/2012 |
| KR | 10-2012-0130891 | 4/2012 |

\* cited by examiner

*Primary Examiner* — Christopher Young
(74) *Attorney, Agent, or Firm* — Muir Patent Law, PLLC

(57) ABSTRACT

A method of manufacturing a semiconductor device includes irradiating a first photoresist layer via a light source, measuring a first exposure intensity of the first photoresist layer, irradiating a second photoresist layer via the light source, measuring a second exposure intensity of the second photoresist layer, subtracting the second exposure intensity from the first exposure intensity, and subsequent to the subtracting, exposing a third photoresist layer formed on a semiconductor substrate by using the light source, wherein an out-of-band (OoB) extreme ultraviolet (EUV) light eliminating layer is formed on the second photoresist layer.

20 Claims, 16 Drawing Sheets

METHOD OF MANUFACTURING A SEMICONDUCTOR DEVICE

CROSS-REFERENCE TO RELATED APPLICATIONS

This application claims priority to Korean Patent Application No. 10-2015-0034041, filed on Mar. 11, 2015, in the Korean Intellectual Property Office, the disclosure of which is incorporated herein in its entirety by reference.

BACKGROUND

The present disclosure relates to a method of measuring an exposure distribution out of an extreme ultraviolet (EUV) band and a method of testing the performance of an EUV scanner using the distribution measurement, and to a method of measuring an exposure distribution of a ray which is out of an EUV band and is exposed to a photoresist layer, and a method of testing the performance of an EUV scanner using the exposure distribution. The present disclosure also relates to a method of manufacturing a semiconductor device using an EUV scanner tested by the methods mentioned above.

As the integration of semiconductor devices is improved, and the line width of semiconductor devices is made minute, lithography technologies using an exposure light having a short wavelength are useful to improve the resolution of a photo lithography.

However, an EUV scanner that is introduced to generate short wavelengths simultaneously generates lights having wavelengths of an out-of-band (OoB) EUV ray that will be used in a lithography processor so as to deteriorate the profile of a circuit pattern transferred onto a wafer.

Therefore, an EUV scanner that minimizes the OoB EUV radiation may be provided or effects of the OoB EUV radiation may be evaluated.

SUMMARY

Aspects of the inventive concept provide a method of measuring an exposure distribution of an out-of-band (OoB) extreme ultraviolet (EUV) band to easily evaluate a performance of an EUV scanner that minimizes the OoB EUV radiation and a method of testing the performance of the EUV scanner using the same. Aspects of the disclosure also provide a method of manufacturing a semiconductor device using an EUV scanner tested by one of the methods mentioned above.

According to an aspect of the disclosure, a method of manufacturing a semiconductor device includes steps of irradiating a first photoresist layer with light via an EUV scanner, developing the first photoresist layer to form a first photoresist pattern, measuring thicknesses of the first photoresist pattern, converting the thicknesses of the first photoresist pattern into a first exposure intensity distribution of the first photoresist layer, irradiating a second photoresist layer, on which an OoB EUV light eliminating layer is formed, with light via the EUV scanner, developing the second photoresist layer to from a second photoresist pattern, measuring thicknesses of the second photoresist pattern, converting the thicknesses of the second photoresist pattern into a second exposure intensity distribution of the second photoresist layer, subtracting the second exposure intensity distribution from the first exposure intensity distribution, based on a result of the subtraction, determining an exposure distribution of an OoB EUV radiation that is generated by the EUV scanner, based on the determining, adjusting or determining passing of the EUV scanner or a part of the EUV scanner, after the adjusting or determining passing, exposing a photoresist layer formed on a substrate using the EUV scanner, and patterning the photoresist layer.

The first and second exposure intensities may be determined by corresponding thicknesses of the first and second photoresist layers after the first and second photoresist layers are developed to remove portions of the photoresist layers. The measurement of the thickness may be performed by a macro inspection device, an ellipsometer, or a leveling sensor.

According to an aspect of the disclosure, a method of manufacturing a semiconductor device includes steps of irradiating a first photoresist layer via a light source, measuring a first exposure intensity of the first photoresist layer, irradiating a second photoresist layer via the light source, measuring a second exposure intensity of the second photoresist layer, subtracting the second exposure intensity from the first exposure intensity, and subsequent to the subtracting, exposing a third photoresist layer formed on a semiconductor substrate by using the light source, wherein an OoB EUV light eliminating layer is formed on the second photoresist layer.

The measuring of the first and second exposure intensities may comprise calculating the first and second exposure intensities based on thickness distributions of the first and second photoresist layers. Each of the thickness distributions of the first and second photoresist layers may be converted into an exposure intensity distribution according to a relationship between thicknesses and exposure intensities, and the relationship may be determined by measuring various photoresist thicknesses varying by corresponding exposure amounts. Each of the thickness distributions of the first and second photoresist layers may be determined according to color intensities of the first and second photoresist layers measured via a macro inspection device, respectively.

The color intensities may be intensities of a color selected from red (R), green (G), or blue (B). Each of the thickness distributions of the first and second photoresist layers may be determined according to changes in polarization states of the first and second photoresist layers, wherein the changes in polarization states may be measured via an ellipsometer before and after reflection of the first and second photoresist layers. Each of the thickness distributions of the first and second photoresist layers may be determined according to changes in heights of upper surfaces of the first and second photoresist layers measured via a leveling sensor.

The measuring of the first and second exposure intensities may include a step of converting the first and second exposure intensities at respective points of the first and second photoresist layers into numerical values, and the eliminating of the second exposure intensity from the first exposure intensity may include steps of subtracting the numerical value of the second exposure intensity from the numerical value of the first exposure intensity of respective points, and calculating an exposure distribution of an OoB EUV radiation based on a numerical value resulting from the subtraction.

The measuring of the first and second exposure intensities may be performed with respect to one or more shot areas per wafer. The measuring of the first and second exposure intensities may include a step of mapping or graphing the first and second exposure intensities. The method may further include a step of measuring exposure distribution of the OoB EUV radiation according to wavelength, wherein the measuring of the exposure distribution may include a step of performing optical tuning with respect to the OoB EUV light eliminating layer.

The first and second photoresist layers may be exposed to light generated from the light source, incident onto a reticle structure, and reflected from the reticle structure. The reticle structure may include a circuit pattern area, a black border that supports an edge of the circuit pattern area, and a reticle mask that prevents predetermined areas from being irradiated with light. The measuring of the first and second exposure intensities may include a step of measuring exposure intensities of light reflected from the black border or exposure intensities of light reflected from the reticle mask.

According to an aspect of the disclosure, a method of manufacturing a semiconductor device includes steps of irradiating a first photoresist layer with light via an EUV scanner and measuring a first exposure intensity of the first photoresist layer, irradiating a second photoresist layer, on which an OoB EUV light eliminating layer is formed, with light via the EUV scanner and measuring a second exposure intensity of the second photoresist layer, subtracting the second exposure intensity from the first exposure intensity and determining, based on a result of the subtraction, an exposure distribution of an OoB EUV radiation that is generated by the EUV scanner, based on the determining, adjusting or determining passing of the EUV scanner, after the adjusting or determining passing, exposing a photoresist layer formed on a substrate using the EUV scanner, and patterning the photoresist layer.

The first and second exposure intensities may be measured by corresponding thicknesses of the first and second photoresist layers after the first and second photoresist layers are developed to remove portions of the photoresist layers. The measurement of the thickness may be performed by a macro inspection device, an ellipsometer, or a leveling sensor.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
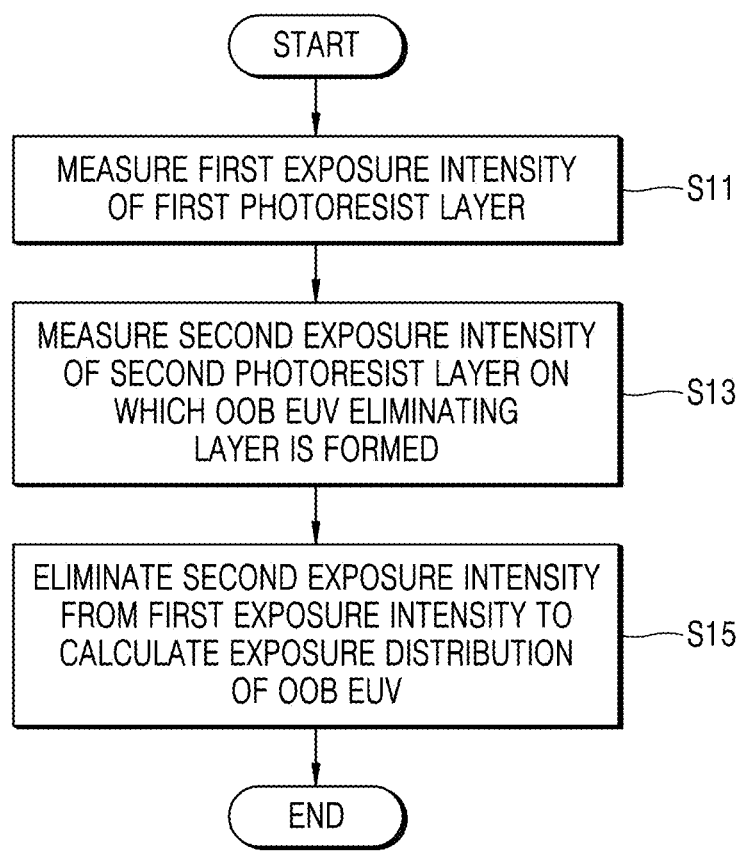
FIG. 1 is a flowchart illustrating a method of measuring an exposure distribution of an out-of-band (OoB) extreme ultraviolet (EUV) band according to an embodiment of the inventive concept.

Embodiments of the inventive concept will now be described more fully with reference to the accompanying drawings, in which exemplary embodiments of the inventive concept are shown. The embodiments may, however, be embodied in many different forms and should not be construed as being limited to the embodiments set forth herein; rather, these embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section, in the detailed description and/or claims without departing from the teachings of exemplary embodiments. In addition, unless the context indicates otherwise, steps described in a particular order need not occur in that order.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity.

Figure 2:
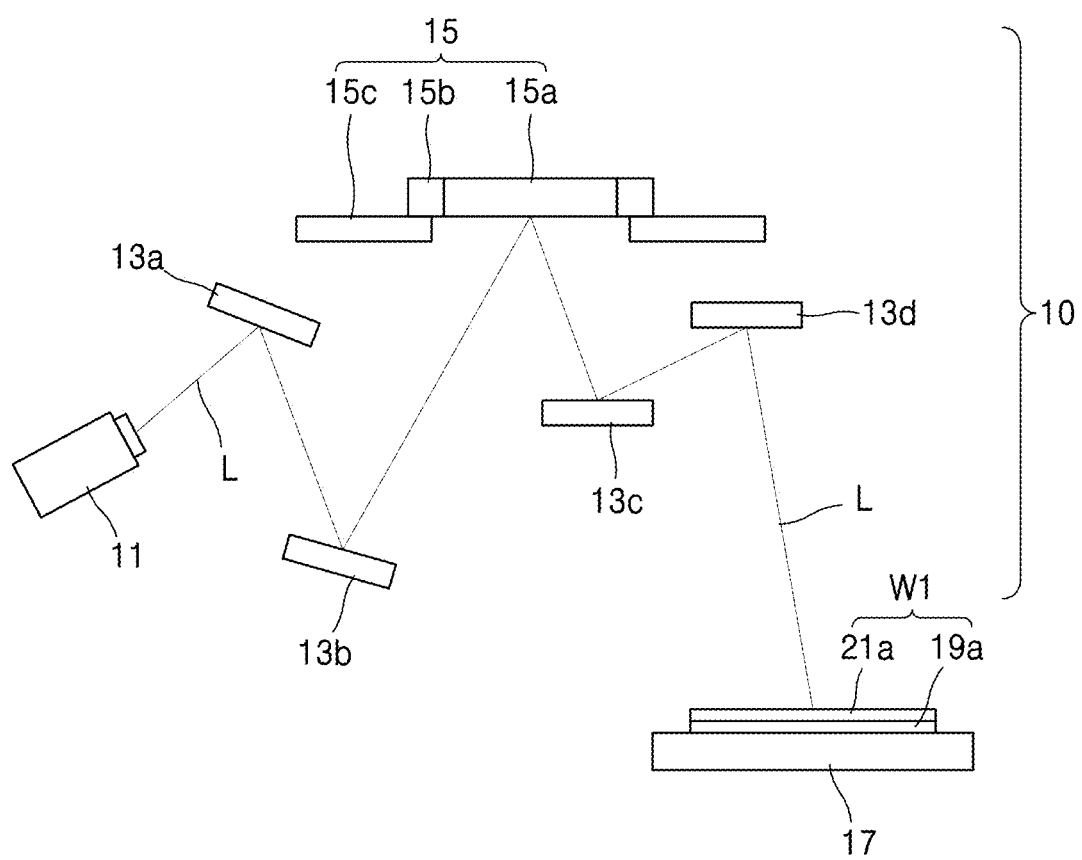
FIG. 2 is a schematic conceptual diagram illustrating an EUV scanner that exposes target wafer to light, with which an exposure distribution of an OoB EUV light is to be measured according to an embodiment of the inventive concept.

FIG. 1 is a flowchart illustrating a method of measuring an exposure distribution of an out-of-band (OoB) extreme ultraviolet (EUV) radiation according to an embodiment of the inventive concept. FIG. 2 is a schematic conceptual diagram illustrating an EUV scanner that exposes a target wafer to light, with which an exposure distribution of an OoB EUV radiation is to be measured according to an embodiment of the inventive concept. As described herein, an OoB EUV band of light means bands of light having wavelengths out of the EUV band. An OoB EUV light may have a wavelength longer than an EUV light. An OoB EUV light may have a wavelength shorter than an EUV light.

Referring to FIGS. 1 and 2, wafer W1 includes a first photoresist layer 21a that is formed on a substrate 19a, and the first photoresist layer 21a is exposed to light L generated by an extreme ultraviolet (EUV) scanner 10.

For example, the EUV scanner 10 makes light L generated by a light source 11 incident onto a reticle structure 15 through a plurality of reflective lenses 13a and 13b. Also, light L that is reflected from the reticle structure 15 is reduced at a preset rate through a plurality of reflective lenses 13c and 13d to be irradiated onto the first photoresist layer 21a formed on the substrate 19a so as to perform an exposure process. The reticle structure 15 may include a reticle including a circuit pattern area 15a and a black border 15b that supports an edge of the circuit pattern area 15a, and a reticle mask 15c that restricts the area of the reticle onto which light L is irradiated. The circuit pattern area 15a absorbs or reflects incident light L based on the pattern of an absorptive layer (not shown) formed on a reflective substrate (not shown), reduces the reflected light L (light pattern) at a preset rate through the plurality of reflective lens 13c and 13d, and transfers the reduced light L onto the first photoresist layer 21a. For example, light L that is incident onto the absorptive layer is absorbed into the absorptive layer, and light L that is incident onto the reflective substrate is reflected from the reflective substrate to be transferred onto the first photoresist layer 21a.

For example, the EUV scanner 10 may be a reflective EUV scanner that makes light L generated by the light source 11 incident onto the reticle structure 15, reflects the light from the reticle structure 15, and irradiates the light L onto the wafer W1. The reflective EUV scanner according to the inventive concept is not limited to the structure shown in FIG. 2.

Since a wavelength of an EUV ray may be shorter than a wavelength of a deep ultraviolet (DUV) ray, the EUV scanner 10 may improve the resolution of a lithography process. EUV band light may be light in a band of about 13.5 nm or less or light in a band of about 13.5 nm. The EUV scanner 10 may generate EUV band light by using one selected from Laser-Produced Plasma (LPP), Discharge Produced Plasma (DPP), and Gas Discharge Produced Plasma (GDPP).

However, an EUV band light source of the EUV scanner 10 may simultaneously generate lights having wavelengths of an OoB EUV band of light that may affect a lithography process.

Figure 3:
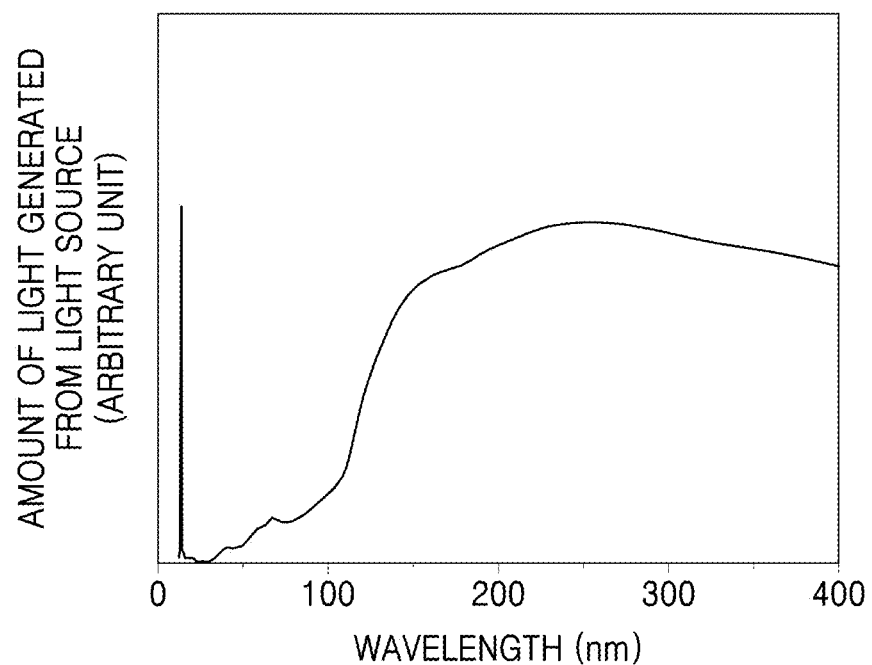
FIG. 3 is a graph illustrating the amount of light according to wavelengths of the lights generated by an EUV band light source according to an embodiment.

FIG. 3 is a graph illustrating the amount of light according to the wavelength of lights generated by an EUV band light source.

Referring to FIG. 3, the EUV band light source mainly generates EUV band light radiation that shows the largest amount (ex. highest intensity) around 13.5 nm that is an EUV band light. However, the light having wavelength between about 100 nm and about 400 nm of an OoB EUV band of light also shows high intensity. Therefore, the EUV band light source may also expose the wafer to the OoB EUV radiation.

The OoB EUV light may be directly irradiated onto a photoresist layer along with the EUV band light to directly affect a circuit pattern profile of the photoresist layer. The OoB EUV radiation may deteriorate a pattern profile uniformity of the photoresist layer. Therefore, a method of evaluating the exposure amount and the exposure distribution of the OoB EUV radiation that is generated from the EUV scanner 10 and then emitted to the wafer may be helpful for improving a photolithography performance. Testing the performance of the EUV scanner 10 may also be helpful to improve a photolithography performance.

Referring to FIGS. 1 and 2 again, light L that is generated by the EUV band light source 11 of the EUV scanner 10 is incident onto and reflected from the reticle structure 15 and then irradiated onto the first photoresist layer 21a. Here, the light L that is irradiated onto the first photoresist layer 21a may include the EUV band light and the OoB EUV band light. According to the method of FIG. 1, in operation S11, a first exposure intensity of the first photoresist layer 21a onto which whole band light is irradiated is measured. In operation S13, a second exposure intensity of a second photoresist layer is measured. In operation S13, the exposure light is an EUV band light which does not include OoB EUV light because OoB EUV waves are removed from the light emanating from the light source 11 by an OoB EUV light eliminating layer. In operation S15, the second exposure intensity is removed from the first exposure intensity to measure an exposure distribution of the OoB EUV radiation.

Figure 4:
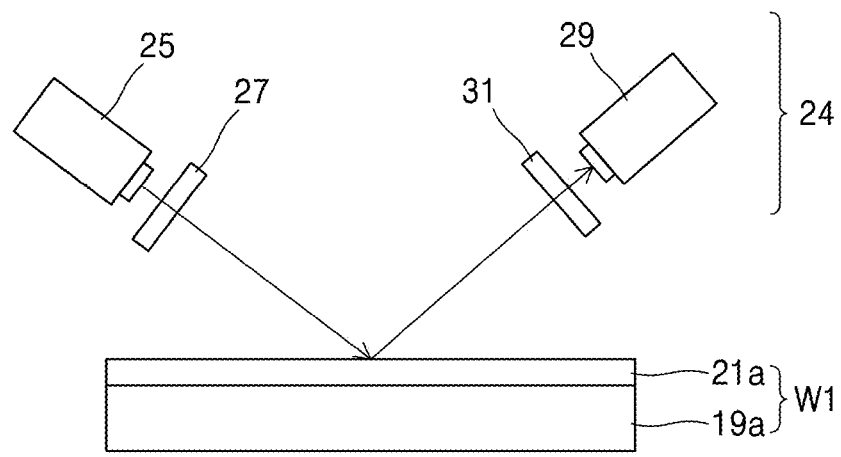
FIG. 4 is a conceptual diagram illustrating an operation of measuring an exposure intensity of a photoresist layer according to an embodiment of the inventive concept.

FIG. 4 is a conceptual diagram illustrating operation S11 of FIG. 1, according to the inventive concept.

Referring to FIGS. 1 and 4, in operation S11, an exposure intensity of the first photoresist layer 21a that is exposed to light may be measured by using a thickness gauge. For example, the exposure intensity of light irradiated onto the first photoresist layer 21a may be measured by the thickness of the first photoresist layer 21a. For example, the photoresist layer 21a may be developed which may have different thicknesses depending on the light intensities or distributions of OoB EUV radiation. Therefore, the thicknesses of the developed photoresist pattern may be converted into the OoB EUV radiation intensities or distributions. An example of the relation between exposure intensities and the thicknesses of a photoresist layer will now be described in detail with reference to FIG. 5.

Figure 5:
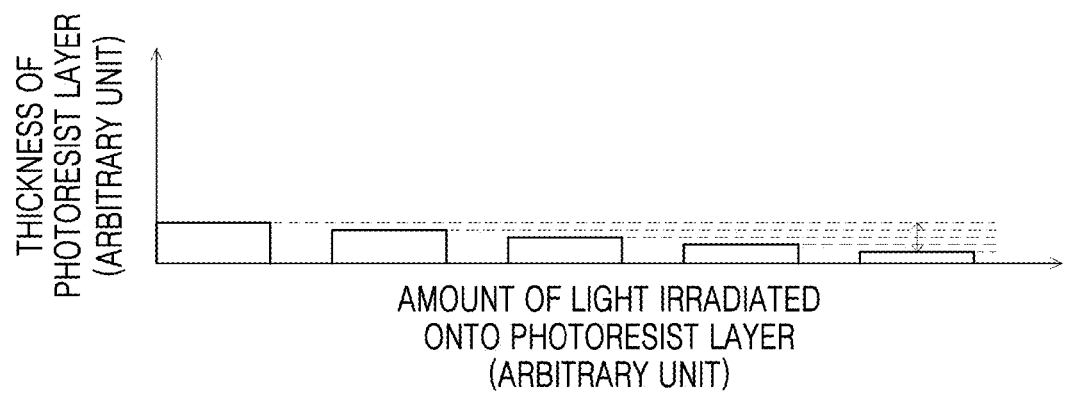
FIG. 5 is a conceptual diagram illustrating the thickness variation of a photoresist layer according to exposure intensities of the photoresist layer according to an embodiment of the disclosure.

FIG. 5 is a conceptual diagram illustrating thicknesses of a photoresist layer according to exposure intensities of the photoresist layer.

Referring to FIG. 5, the thickness of the first photoresist layer 21a decreases with an increase in an exposure intensity of the first photoresist layer 21a. For example, an area of the first photoresist layer 21a exposed to light has a high resolution due to a cross link or a photolysis. Here, the degree of the cross link or photolysis of the first photoresist layer 21a varies according to the exposure intensity of the first photoresist layer 21a. If a developing process is performed on the first photoresist layer 21a that is exposed to the light, the exposed area is selectively removed. Here, the thickness of the first photoresist layer 21a that remains after the developing process varies according to the degree of the cross link or photolysis. For example, when the first photoresist layer 21a is a positive type, the higher the exposure intensity of light, the more photoresist is removed. Therefore, a higher exposure intensity causes a reduced thickness of the first photoresist layer 21a. When the first photoresist layer 21a is a negative type, the higher the exposure intensity of the light, the less photoresist is removed. Therefore, for a negative type photoresist, a higher exposure intensity results in a greater thickness of the first photoresist layer 21a than a lower exposure intensity is used. For example, a positive type photoresist is decomposed by a light, and a negative type photoresist is crosslinked by a light.

Therefore, if thicknesses of the first photoresist layer 21a that remain after the development are respectively measured, a relation formula between the exposure intensity and the thickness of the first photoresist layer 21a may be acquired. The relation formula may be experimentally determined, and the exposure intensity of the first photoresist layer 21a may be calculated from the thickness of the first photoresist layer 21a by using the relation formula. If the above-described measurement process is performed with respect to the first photoresist layer 21a throughout the whole wafer, an exposure intensity distribution throughout the area covered by the wafer may be calculated. For example, an exposure intensity distribution of the first photoresist layer 21a may be calculated by a first thickness distribution of the first photoresist layer 21a.

To acquire the relation formula between the thickness and the exposure intensity of the first photoresist layer 21a, the photoresist layer 21a formed on the substrate 19a may be exposed to light with varying exposure intensities according to shot areas, and thicknesses of the remaining first photoresist layer 21a may be measured. A method of experimentally determining the relation formula between the thickness and the exposure intensity of the first photoresist layer 21a will be described later. The shot area may also be called as a field area or a unit scan area. The shot area may refer to a unit area that is exposed to light when the EUV scanner 10 illuminates light on the wafer.

Referring to FIG. 4 again, a thickness measurement device 24 for measuring the exposure intensity of the first photoresist layer 21a may include a light source 25, a projection part 27, a detection part 31, and a detector 29. The thickness measurement device 24 may be a macro inspection device, an ellipsometer, or a leveling sensor.

According to exemplary embodiments, a macro inspection device may be used to measure a first exposure intensity from a first thickness distribution. The macro inspection device is a device that captures and reads an image of a photoresist layer and may measure the first thickness distribution of the first photoresist layer 21a from a color intensity of the first photoresist layer 21a.

Figure 6:
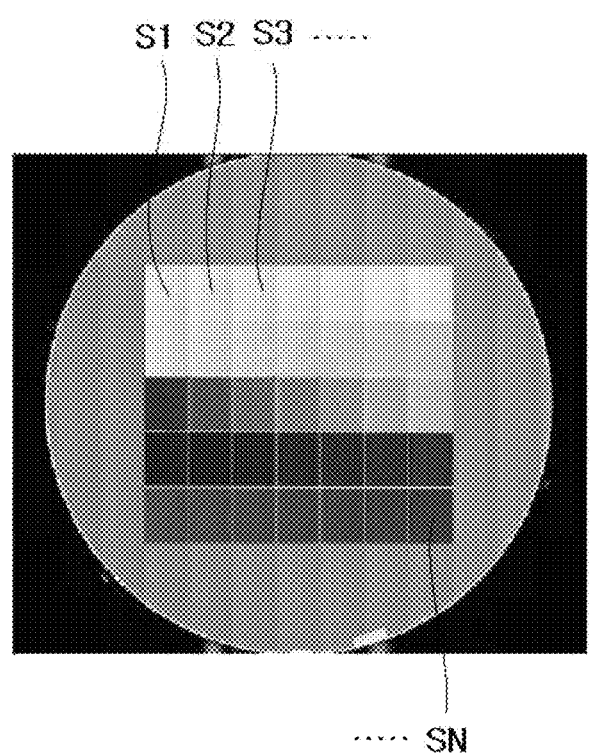
FIG. 6 is a view illustrating an exemplary color intensity distribution of a photoresist layer according to shot areas having different exposure intensities.

FIG. 6 is a view illustrating a color intensity of a photoresist layer having different exposure intensities according to shot areas S.

Referring to FIG. 6, a relation formula between a thickness and an exposure intensity of the photoresist layer is calculated by using a macro inspection device. For example, a relation formula between a color intensity and an exposure intensity of an image reflecting a thickness may be calculated by using the macro inspection device. If the photoresist layer is captured by an imaging device of the macro inspection device, reflected light varies according to the thickness of the photoresist layer, and thus the color intensity of a captured image varies. For example, the images of photoresist layers having different thicknesses may have different colors, and each thickness of a photoresist layer may match a corresponding color. Therefore, if a relation formula between the color intensity of the image and the exposure intensity is determined, only the color intensity of the image of the photoresist layer may be measured to determine an exposure intensity.

A sample photoresist layer is formed on a substrate that is divided into first, second, third, . . . , and $N^{th}$ shot areas S1, S2, S3, . . . , and SN. Whenever an EUV scanner moves into one shot area, the EUV scanner adjusts the first, second, third, . . . , and $N^{th}$ shot areas S1, S2, S3, . . . , and SN to have first, second, third, . . . , and Nth exposure intensities increasing by a preset exposure intensity so as to scan the first, second, third, . . . , and $N^{th}$ shot areas S1, S2, S3, . . . , and SN. The increment of the exposure intensity of the EUV scanner between two adjacent shot areas may be between about 0.05 mJ/cm$^2$ and about 0.2 mJ/cm$^2$.

If a photoresist layer is exposed by different exposure intensities or light in the first, second, third, . . . , and $N^{th}$ shot areas S1, S2, S3, . . . , and SN, and is developed, the photoresist layer may have different thicknesses, such as first, second, third, . . . , and $N^{th}$ thicknesses in the corresponding first, second, third, and $N^{th}$ shot areas S1, S2, S3, . . . , and SN. For example, since the first, second, third, . . . , and $N^{th}$ shot areas S1, S2, S3, . . . , and SN have the first, second, third, . . . , and $N^{th}$ exposure intensities that gradually increase, first, second, third, . . . , and $N^{th}$ thicknesses of the photoresist layer which become gradually thinner may be formed in the corresponding first, second, third, . . . , and $N^{th}$ shot areas S1, S2, S3, . . . , and SN.

If the whole area of the substrate on which the photoresist layer is formed is captured by using the imaging device of the macro inspection device, the first, second, third, . . . , and $N^{th}$ shot areas S1, S2, S3, . . . , and SN respectively show first, second, third, . . . , and $N^{th}$ color intensities that may be different from one another, due to the first, second, third, . . . , and $N^{th}$ thicknesses. The first, second, third, . . . , and $N^{th}$ color intensities may be expressed in numerical values, and the relations between the first, second, third, . . . , and $N^{th}$ exposure intensities and the first, second, third, . . . , and $N^{th}$ color intensities of the first, second, third, . . . , and $N^{th}$ shot areas S1 S2, S3, . . . and SN may be calculated into a relation formula. As described above, if the macro inspection device is used, exposure intensities may be respectively calculated from differences between color intensities caused by thicknesses of a photoresist layer. Each of the first, second, third, . . . , and $N^{th}$ color intensities may include R, G, and B components. And exposure intensities on each of the first, second, third, . . . , and $N^{th}$ color intensities may be determined by one component selected from the R, G, and B components. The selected one component may show larger color intensity differences than the other components.

Figure 7:
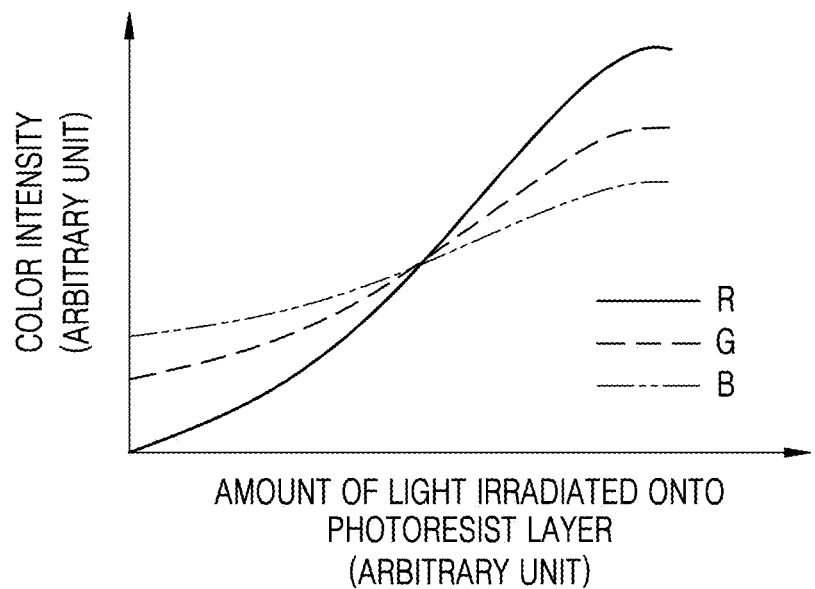
FIG. 7 is a graph illustrating exemplary color intensities of red (R), green (G), and blue (B) components according to amounts of exposure light irradiated onto a photoresist layer.

FIG. 7 is a graph illustrating R, G, and B components of a color intensity according to an exposure intensity irradiated onto a photoresist layer.

Referring to FIG. 7, the R, G, and B components of the color intensity show different change rates according to the relation formulas between the first, second, third, . . . , and $N^{th}$ exposure intensities and the first, second, third, . . . , and $N^{th}$ color intensities of FIG. 6. Also, among the R, G, and B components of the color intensity, the color intensity difference in the R component is the largest. Therefore, the first, second, third, . . . , and $N^{th}$ color intensities may be expressed by using the color intensity of an R component having a large color intensity difference.

Referring to FIG. 4 again, an exposure distribution may be easily measured from a color intensity distribution of each point of the first photoresist layer 21a by using the relation formula between the color intensity and the exposure intensity of the image reflecting the thickness of the first photoresist layer 21a.

According to other exemplary embodiments, an ellipsometer may be used to measure the exposure distribution of the photoresist layer 21a from the thickness distribution of the first photoresist layer 21a. An ellipsometer is a device that measures a thickness of a thin film by using the polarization characteristic of light. If a light having a known polarization state is irradiated onto the first photoresist layer 21a, the polarization state may be changed by a surface of the first photoresist layer 21a, and the thickness of the first photoresist layer 21a may be measured from the changes in the polarization state before and after reflection. The polarization state and the change in the polarization state may be numerically expressed by using a reflection coefficient ratio between p and s waves and a phase difference $\Delta$ between the p and s waves. Here, an analysis modeling method may be introduced to measure the thickness of the first photoresist layer 21a. For example, the thickness of the photoresist layer of the theoretical model may be adjusted for the theoretical values $\psi'$ and $\Delta'$ to have the same values as $\psi$ and $\Delta$ of the first photoresist layer 21a, and the thickness of the photoresist layer of the theoretical model may be detected as the thickness of the first photoresist layer 21a. Here, the value $\psi'$ is the reflection coefficient ratio and the value $\Delta'$ is the phase difference between the p and s waves of the theoretical model light before and after reflection on a theoretical photoresist layer, and the value $\psi$ is the reflection coefficient ratio and the value $\Delta$ is the phase difference between the p and s waves of the light before and after reflection on the first photoresist layer 21a.

Figure 8:
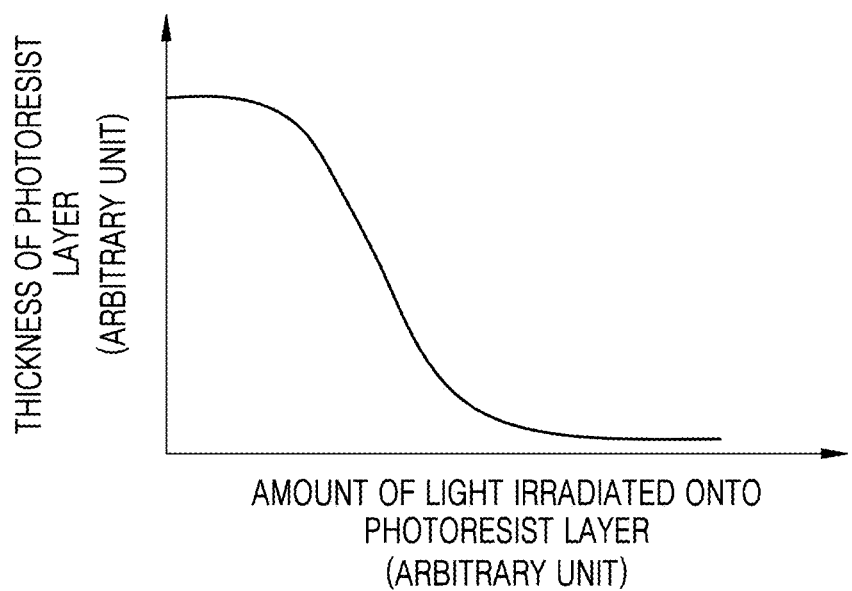
FIG. 8 is a graph illustrating an exemplary relation between an exposure intensity and a thickness of a photoresist layer measured by using an ellipsometer.

The relation formula between the exposure intensity and the thickness of the first photoresist layer 21a may be calculated by using the ellipsometer. As described above, first, second, third, . . . , and $N^{th}$ shot areas S1, S2, S3, . . . , and SN of a sample photoresist layer may be exposed to lights so as to respectively have first, second, third, . . . , and $N^{th}$ exposure intensities. The first, second, third, . . . , and $N^{th}$ shot areas S1, S2, S3, . . . , and SN having different exposure intensities have different thicknesses after being developed. Also, the different thicknesses may be numerically calculated as first, second, third, . . . , and $N^{th}$ thicknesses through the ellipsometer. Therefore, a relation formula may be calculated by using corresponding relations between the first, second, third, . . . , and $N^{th}$ exposure intensities and the first, second, third, . . . , and $N^{th}$ thicknesses. FIG. 8 is a graph illustrating a relation between a set of exposure intensities and the corresponding thicknesses measured by using an ellipsometer.

A first exposure distribution of the first photoresist layer 21a may be easily measured from a thickness distribution of each point of the first photoresist layer 21a by using a relation formula between the exposure intensity and the thickness.

According to other exemplary embodiments, a leveling sensor may be used to measure the first exposure distribution of the first photoresist layer 21a from the thickness of the first photoresist layer 21a. A leveling sensor is a device that may measure a thickness of a thin film through changes in heights of an upper surface of the thin film.

Similarly to the above description, a relation formula between an exposure intensity and a thickness may be calculated by using the leveling sensor. The first, second, third, . . . , and $N^{th}$ shot areas S1, S2, S3, . . . , and SN of the sample photoresist layer may respectively have different thicknesses after being developed, and the different thicknesses may be numerically expressed as first, second, third, . . . , $N^{th}$ thicknesses through the leveling sensor. Therefore, the relation formula between the exposure intensities and the thicknesses may be calculated by using corresponding relations between the first, second, third, and $N^{th}$ exposure intensities and the first, second, third, . . . , and $N^{th}$ thicknesses.

A first exposure distribution of the first photoresist layer 21a may be easily measured from a thickness distribution of each point of the first photoresist layer 21a by using the relation formula between the exposure intensity and the thickness.

As described with reference to FIG. 4, the thickness measurement device 24 for measuring the first exposure distribution of the first photoresist layer 21a may be a macro inspection device, an ellipsometer, or a leveling sensor but is not limited thereto. According to exemplary embodiments, the thickness measurement device 24 used in operation S11 of measuring the first exposure distribution may be any type of device that may directly or indirectly measure a thickness of the first photoresist layer 21a. According to exemplary embodiments, all types of methods of measuring the first exposure distribution without measuring the thickness of the first photoresist layer 21a may be applied in operation S11 of measuring the first exposure distribution.

Figure 9:
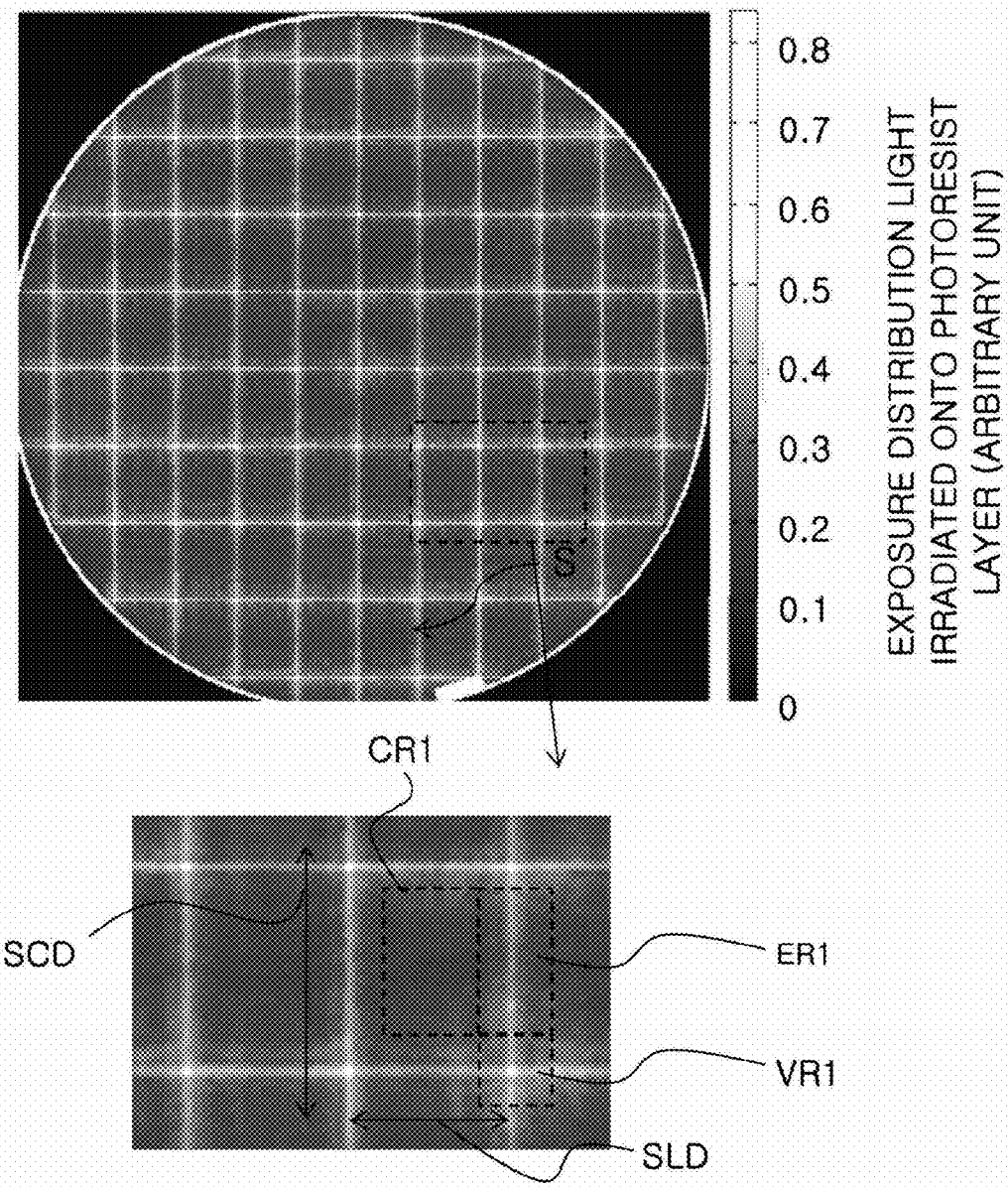
FIG. 9 is a map illustrating an exemplary exposure intensity on a wafer level of a photoresist layer.

FIG. 9 is a map illustrating a first exposure intensity of a first photoresist, which is exposed to light by the EUV scanner 10 of FIG. 2, on a wafer level.

Referring to FIG. 9, an edge part ER1 of each shot area S has a relatively higher light intensity than a central part CR1 of the shot area S, and a vertex part VR1 of the shot area S has a relatively higher light intensity than the edge part ER1 of the shot area S. According to a relation formula between a light intensity and the corresponding thickness as described with reference to FIG. 4, the vertex part VR1 of the shot area S has a larger amount of exposure than the edge part ER1 of the shot area S. Also, the edge part ER1 of the shot area S has a larger amount of exposure than the central part CR1 of the shot area S. As described above, an exposure intensity may be read as a map by using methods as described with reference to FIG. 4.

Figure 10A:
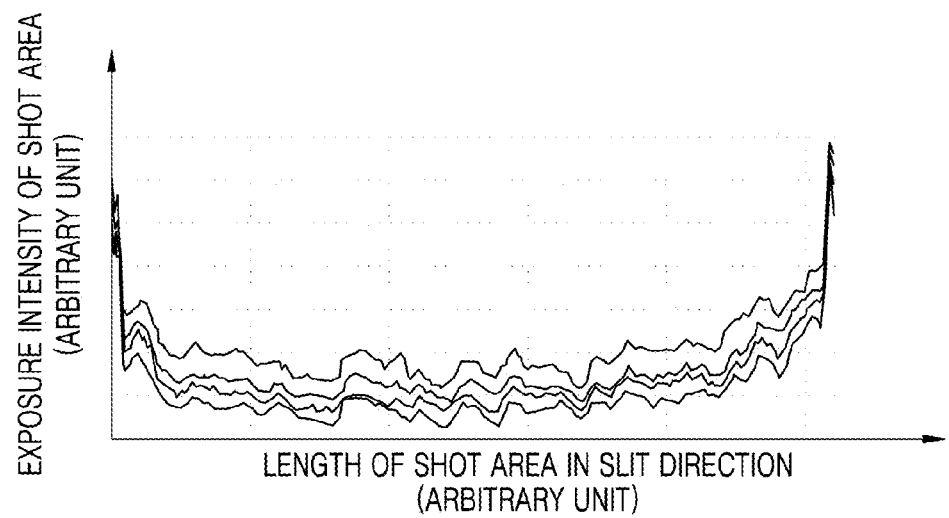
FIGS. 10A and 10B are graphs illustrating exemplary exposure distributions in a shot area of a photoresist layer exposed to light by a EUV scanner.
Figure 10B:
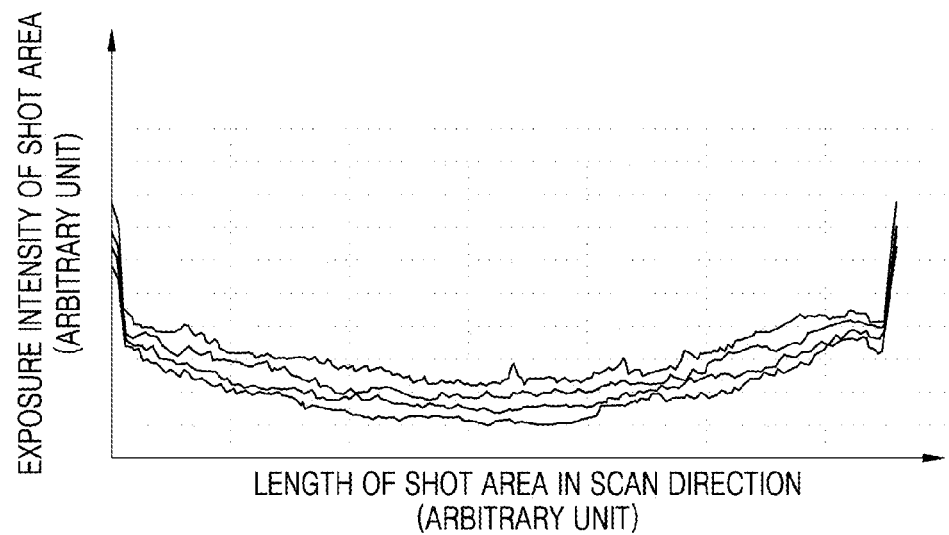

FIGS. 10A and 10B are graphs illustrating an exposure intensity in a shot area of a photoresist exposed to light by an EUV scanner. FIG. 10A is a graph illustrating an exposure intensity of the shot area S in its slit direction SLD for irradiating light into the shot area S. FIG. 10B is a graph illustrating an exposure intensity of the shot area S in its scan direction SCD for exposing the shot area S to light toward a slit.

Referring to FIGS. 9, 10A, and 10B, the exposure intensity is relatively uniform in the central part CR1 of the shot area S in both the slit direction SLD and the scan direction SCD. However, exposure intensities of both edge parts ER1 of the shot area S increase more sharply than the exposure intensity of the central part CR1 of the shot area S. As described above, a first exposure intensity of a first photoresist may be quantitatively measured to be made a graph by using the methods described with reference to FIG. 4.

Referring to FIG. 1 again, besides operation S11 of measuring the first exposure intensity of the first photoresist layer 21a of FIG. 4, operation S13 of measuring a second exposure intensity of a second photoresist layer on which an out-of-EUV band light eliminating layer 23 is formed is further performed.

Figure 11:
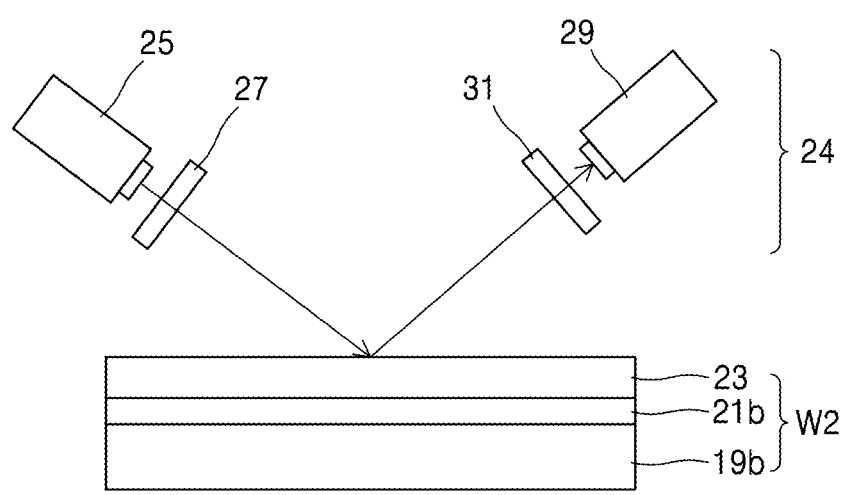
FIG. 11 is a conceptual diagram illustrating an operation of measuring an exposure intensity of a photoresist layer according to certain embodiments of the inventive concept.

FIG. 11 is a conceptual diagram illustrating operation S13 of measuring a second exposure intensity of a second photoresist layer 21b according to an embodiment of the inventive concept. Operation S13 is different from operation S11 described with reference to FIGS. 1 and 4 in that the out-of-band light eliminating layer 23 is further formed on the second photoresist layer 21b, and subsequent processes are similar to each other. Therefore, repeated descriptions are omitted.

Referring to FIGS. 1 and 11, wafer W2 include a substrate 19b, a second photoresist layer 21b formed on the substrate 19b, and an out-of-EUV band light eliminating layer 23 formed on the second photoresist layer 21b. If out-of-band EUV light that will be used for exposure is irradiated onto the second photoresist layer 21b from the EUV scanner, all parts or a part of the out-of-EUV band light may be removed by the out-of-EUV band light eliminating layer 23. Therefore, the second photoresist layer 21b formed underneath the out-of-EUV band light eliminating layer 23 may be less affected by OoB EUV radiation.

According to exemplary embodiments, the out-of-EUV band light eliminating layer 23 may eliminate all or a part of light having a wavelength between about 100 nm and about 400 nm. Therefore, the second photoresist layer 21b formed underneath the out-of-EUV band light eliminating layer 23 may be less affected by OoB EUV radiation. Therefore, the first exposure intensity of the first photoresist layer 21a described with reference to FIG. 4 may be a sum of an EUV band light exposure intensity and an out-of-EUV band light exposure intensity, and the second exposure intensity of the second photoresist layer 21b may nearly be the EUV band light exposure intensity.

According to exemplary embodiments, the out-of-EUV band light eliminating layer 23 may be optically tuned to include at least one selected from a plurality of materials that eliminate various wavelengths. In this case, the exposure intensity of the OoB EUV light may be measured according to wavelength bands. For example, if the out-of-EUV band light eliminating layer 23 includes a material that eliminate a particular band of light, the exposure intensity of the particular band of light may be calculated by the above method. Similarly, two or more materials may be included in the out-of-EUV band light eliminating layer 23 to measure an exposure intensity of the corresponding band of light.

An EUV scanner makes light, which is generated by a light source, incident onto and reflected from a reticle structure to irradiate the reflected light onto the second photoresist layer 21b. The EUV scanner or a developer develops the second photoresist layer 21b exposed to light. In operation S13, the second exposure intensity of the developed second photoresist layer 21b may be measured by the thickness measurement device 24. For example, a second exposure intensity irradiated onto the second photoresist layer 21b may be determined by converting the thickness of the second photoresist layer 21b into a corresponding exposure intensity. The second thickness distribution of the second photoresist layer 21b is measured by a thickness measurement device 24. The thickness measurement device 24 for measuring an exposure of the second photoresist layer 21b may be a macro inspection device, an ellipsometer, or a leveling sensor.

Figure 12:
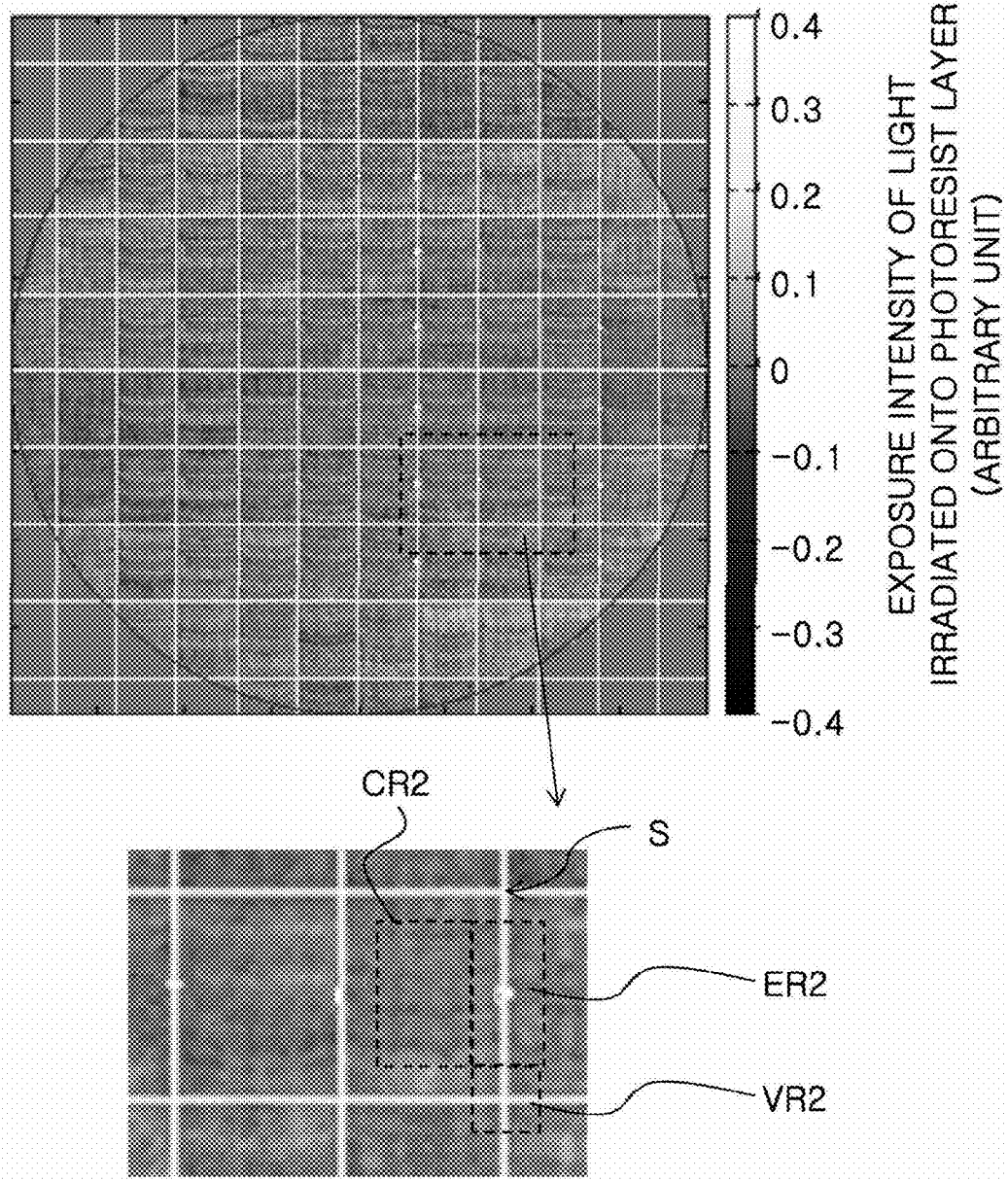
FIG. 12 is a map illustrating an exemplary exposure intensity of the photoresist layer of FIG. 11, on which an out-of-EUV band light eliminating layer is formed, on a wafer level.

FIG. 12 is a map illustrating a second exposure intensity of the second photoresist layer 21b, on which the out-of-EUV band light eliminating layer 23 of FIG. 11 is formed, on a wafer level.

Referring to FIG. 12, the second exposure intensity of the second photoresist layer 21b on which the out-of-EUV band light eliminating layer 23 is formed is different from the first exposure intensity of the first photoresist layer 21a described with reference to FIG. 9. As described with reference to FIG. 9, the edge part ER1 and the vertex part VR1 of the shot area S have higher exposure intensities than the central part CR1 of the shot area S. Therefore, the first exposure intensity is non-uniform. However, according to the second exposure intensity, a central part CR2, an edge part ER2, and a vertex part VR2 of each shot area S show relatively uniform exposure intensities. In consideration of the first exposure intensity and the second exposure intensity, a light amount of an OoB EUV emission irradiated by the EUV scanner has an exposure intensity that is mainly irradiated on the edge part ER1 and the vertex part VR1 of the shot area S.

As to the second exposure intensity of the second photoresist layer 21b, because all or a part of an OoB EUV radiation is eliminated by the out-of-EUV band light eliminating layer 23, the whole exposure amount irradiated onto the second photoresist layer 21b decreases compared to the exposure amount irradiated onto the first photoresist layer 21a of FIG. 4. Therefore, the first exposure intensity of FIG. 9 shows an exposure between about 0.2 and about 0.6 throughout wafer, but the second exposure intensity of FIG. 12 shows an exposure level between about −0.1 and 0.1. As a result, an out-of-EUV band light eliminating layer that brings a loss of an exposure may be used, and the EUV scanner may generate a small amount of the OoB EUV light. For example, it is useful to apply an out-of-EUV band light eliminating layer in an EUV scanner and/or in an EUV light exposure process even though it brings a loss of exposure light energy when an out-of-EUV band light is eliminated from a light source by the OoB EUV band light eliminating layer. The above method of measuring the intensity or amount of the out-of-EUV band light is also useful for examining an EUV scanner how much out-of-EUV band light is generated from the EUV scanner and is emitted to a photoresist.

Figure 13A:
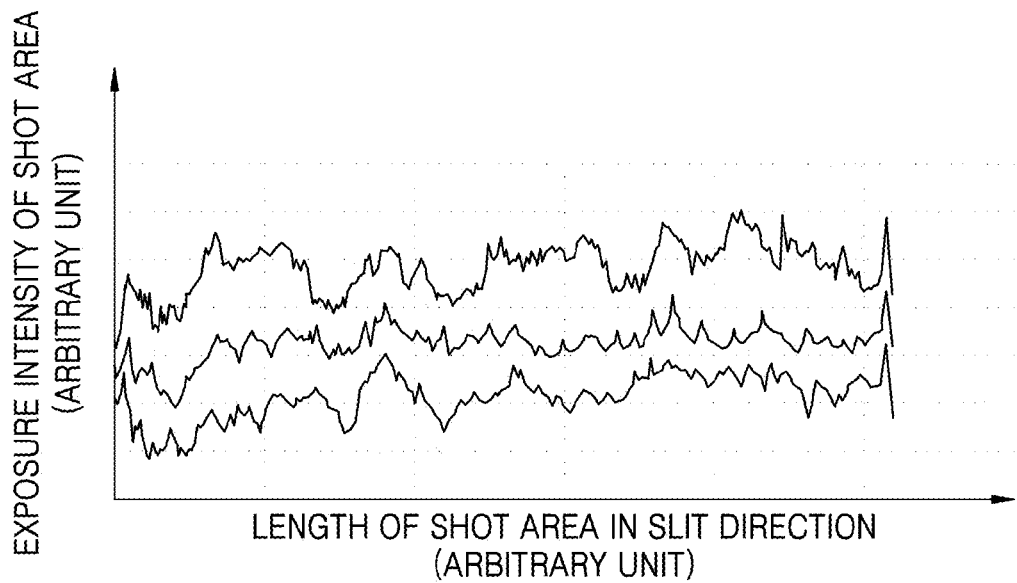
FIGS. 13A and 13B are graphs illustrating exemplary exposure distributions in a shot area of a photoresist layer exposed to light by an EUV scanner.
Figure 13B:
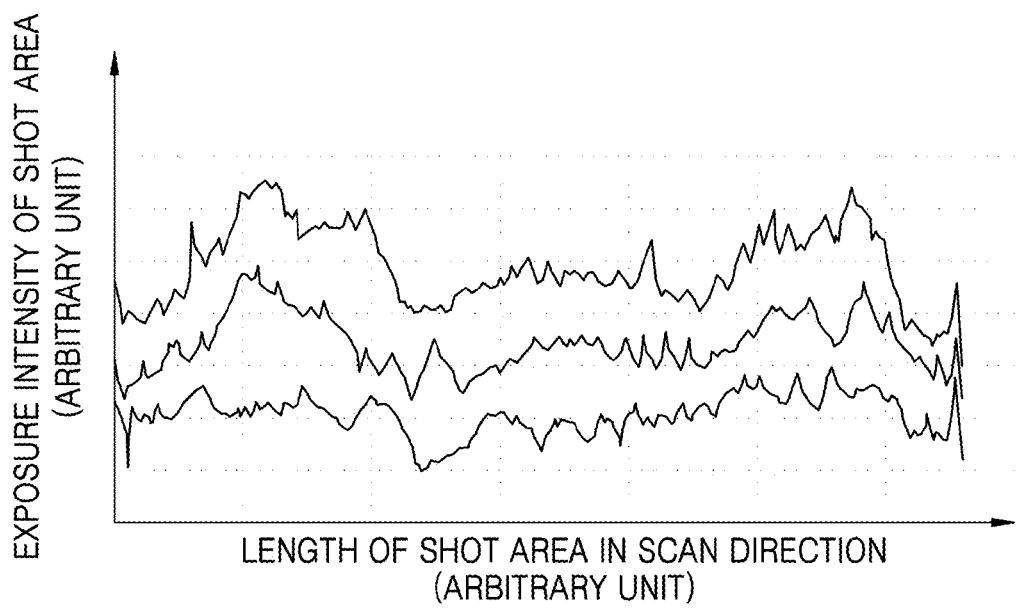

FIGS. 13A and 13B are graphs illustrating a second exposure intensity of a shot area S of a second photoresist layer exposed to light by an EUV scanner. FIG. 13A is a graph illustrating the second exposure intensity of the shot area S toward a slit direction SLD. FIG. 13B is a graph illustrating the second exposure intensity of the shot area S toward a scan direction SCD.

Referring to FIGS. 12, 13A, and 13B, as to the second exposure intensity, the central part CR1 of the shot area S has a relatively uniform exposure amount in the slit direction SLD and the scan direction SCD. However, exposure amounts of both edge parts ER1 of the shot area S increase more sharply than the central part CR1 of the shot area S.

Referring to FIG. 1, after operations S11 and S13 are performed, operation S15 is performed.

Referring to FIGS. 4, 9, 10A, and 10B, the first exposure intensity of the first photoresist layer 21a may be a sum of an EUV band light exposure intensity and an out-of-EUV band light exposure intensity because the light irradiates from the EUV scanner without being filtered. Since an OoB EUV band light is eliminated by the out-of-EUV band light eliminating layer 23, the second exposure intensity of the second photoresist layer 21b may be mainly an EUV band light exposure intensity. Therefore, if the second exposure intensity is eliminated from the first exposure intensity, an exposure distribution of an OoB EUV radiation may be acquired. Operations S11 and S13 include an operation of making the first and second exposure intensities of respective points of the first and second photoresist layers 21a and 21b into numerical values as described above with reference to FIGS. 4 and 11. Therefore, in operation S15, the second exposure intensity made into the numerical value may be removed from the first exposure intensity made into the numerical value to calculate an exposure distribution of an OoB EUV radiation that is made into a numerical value.

Referring to FIGS. 9 and 12, the light intensity distribution of the map of FIG. 12 illustrating the second exposure intensity may be eliminated from the light intensity distribution of the map of FIG. 9 illustrating the first exposure intensity to show a map illustrating an exposure distribution of an OoB EUV radiation.

Referring to FIGS. 10A, 10B, 13A, and 13B, the second exposure intensity of FIG. 13A in the slit direction is eliminated from the first exposure intensity of FIG. 10A in the slit direction to show a graph illustrating an exposure distribution of an OoB EUV radiation in the slit direction. Also, the second exposure intensity of FIG. 13B in the scan direction is eliminated from the exposure intensity of FIG. 10B in the scan direction to show a graph illustrating an exposure distribution of an OoB EUV radiation.

The first exposure intensity, the second exposure intensity, and the exposure distribution of the OoB EUV band light may be quantized, mapped, or made into a graph. Also, a plurality of shot areas or one shot area may be quantized, mapped, or made into a graph on a wafer level.

Figure 14A:
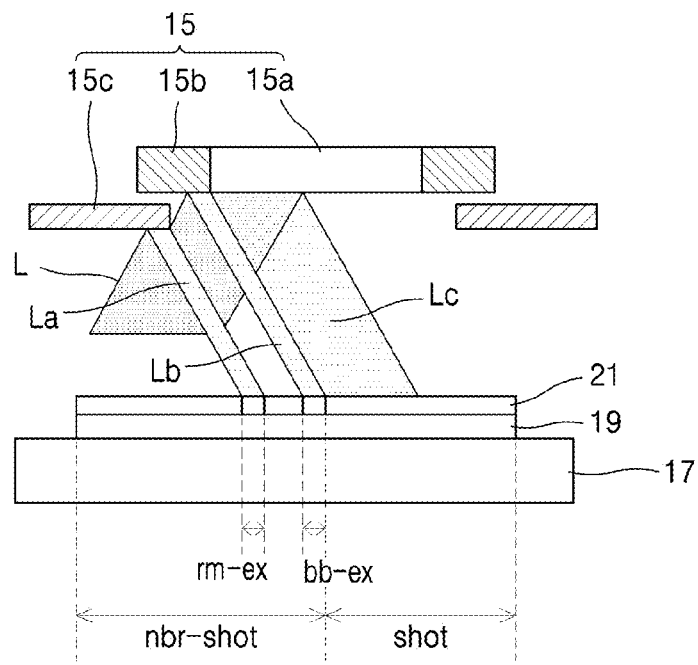
FIG. 14A is a conceptual diagram of an exemplary process of exposing one shot area to light by using a EUV scanner.

FIG. 14A is a conceptual diagram illustrating a process of exposing one shot area to light by using an EUV scanner.

Referring to FIG. 14A, most of light L generated from an EUV band light source is incident onto a circuit pattern area 15a of a reticle structure 15. Also, light Lc reflected from the circuit pattern area 15a is transferred onto a shot area of a photoresist layer 21 formed on a substrate 19 based on an image of the circuit pattern area 15a. However, some of the light L may be exposed to another nearby shot area nbr-shot near by the shot area because light Lb is reflected from the black boarder 15b around the circuit pattern area 15a and/or light La is reflected from the reticle mask 15c.

For example, the light L generated from a reflective EUV scanner is obliquely incident onto the reticle structure 15. Therefore, EUV band light that is incident onto the reticle mask 15c is absorbed into the reticle mask 15c, but the out-of-EUV band light is not absorbed into and is reflected from the reticle mask 15c due to a characteristic thereof. The light La that is reflected form the reticle mask 15c is mainly out-of-EUV band light and is irradiated onto a photoresist layer of the nearby shot area nbr-shot. All of EUV band light and out-of-EUV band light of the light that is incident onto the black boarder 15b are reflected. The light Lb that is reflected from the black boarder 15b includes all of the EUV band light and the out-of-EUV band light and is irradiated onto the photoresist layer of the nearby shot area nbr-shot that is near by the shot area.

Figure 14B:
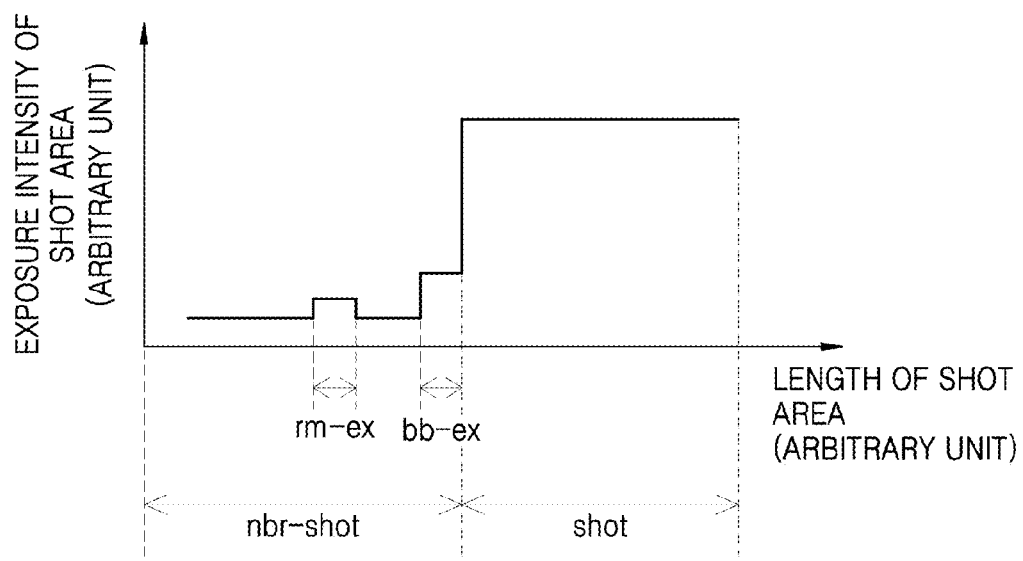
FIGS. 14B through 14D are graphs illustrating an operation of measuring an exposure distribution of an OoB EUV radiation according to certain embodiments of the inventive concept.
Figure 14C:
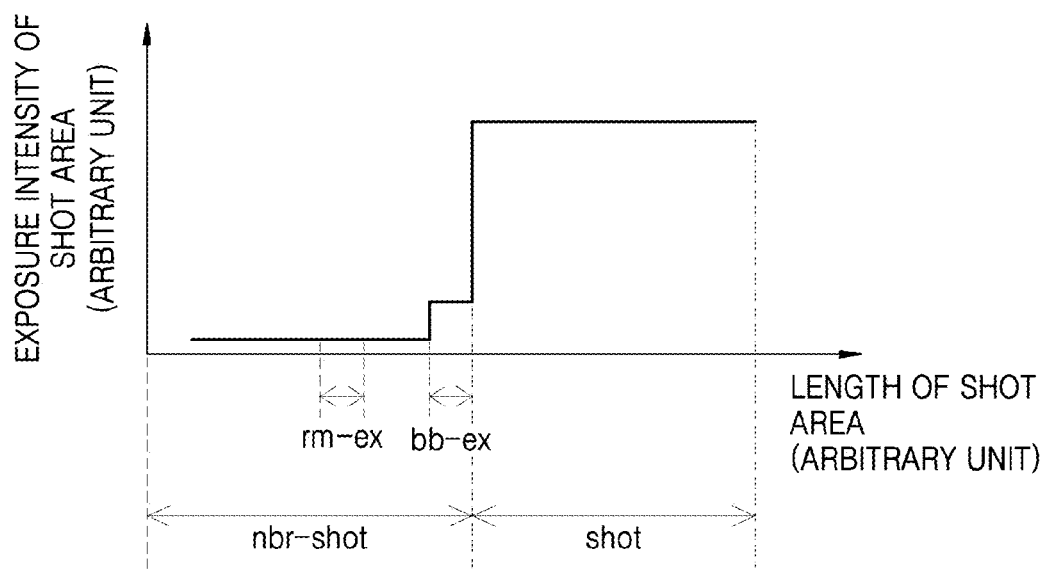
Figure 14D:
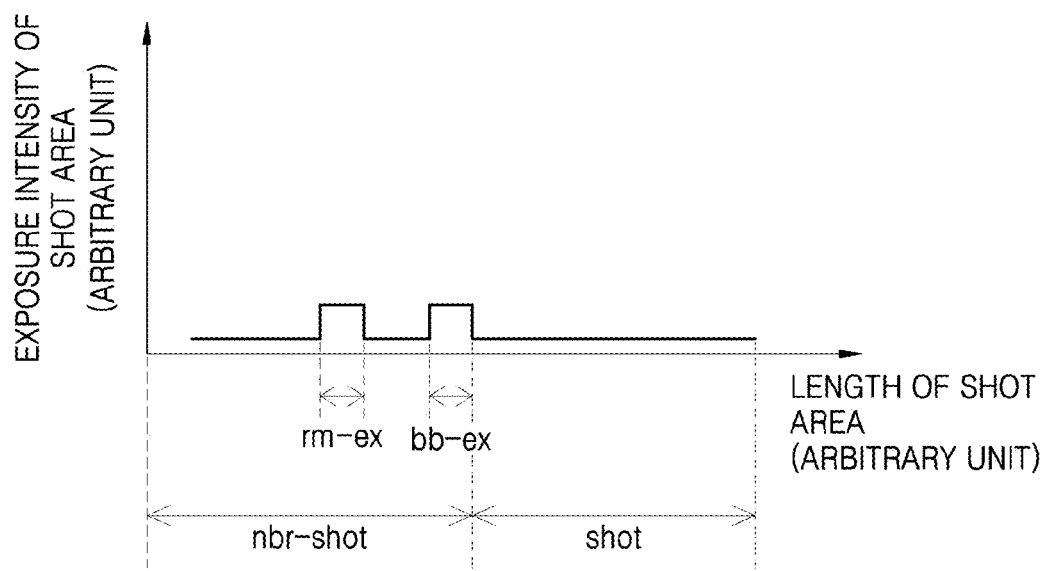

FIGS. 14B through 14D are graphs illustrating an operation of measuring an exposure distribution of an OoB EUV radiation after performing the process of exposing one shot area to light described with reference to FIG. 14a, according to the inventive concept.

FIG. 14B is a graph illustrating operation S11 of measuring a first exposure intensity of a photoresist layer in one shot area.

Referring to FIG. 14B, in the circuit area 15a, most of the light irradiated on the circuit area is reflected onto a shot area. Therefore, the shot area has a higher exposure intensity than the other areas. For example, since most of the light L generated from a light source is irradiated onto a shot area, the shot area has a higher exposure intensity than, for example, the nearby shot area nbr-shot. An area bb-ex of the nearby shot area nbr-shot, onto which the light Lb reflected from the black boarder 15b is irradiated, includes both of EUV band light and out-of-EUV band light. Therefore, the area bb-ex has a relatively higher exposure intensity than the exposure intensity of the other nearby shot area nbr-shot. An area rm-ex of the nearby shot area nbr-shot, onto which the light La reflected from the reticle mask 15c is irradiated, mainly includes out-of-EUV band light and thus has a lower exposure intensity than the area bb-ex onto which the light LB reflected from the black board 15b is irradiated. For example, the light La may include less EUV band light and most of the light La may be out-of-EUV band light.

FIG. 14C is a graph illustrating operation S13 of measuring a second exposure intensity of a second photoresist layer in one shot area. An out-of-EUV band light eliminating layer is formed on the second photoresist layer.

Referring to FIG. 14C, since the out-of-EUV band light eliminating layer is formed on the second photoresist layer, most of out-of-EUV band light may not be exposed to the second photoresist layer. Therefore, exposure intensities of the out-of-EUV band light may be removed from the shot area, the area bb-ex onto which the light Lb reflected from the black boarder 15b is irradiate, and the area rm-ex onto which the light La reflected from the reticle mask 15 is irradiate. For example, the second photoresist layer may not be exposed to out-of-EUV band light.

FIG. 14D is a graph of an exposure intensity illustrating a result of an operation S15 eliminating the second exposure intensity from the first exposure intensity.

Referring to FIG. 14B, the second exposure intensity of FIG. 14C may be eliminated from the first exposure intensity of FIG. 14B. In this case, a graph illustrating an exposure distribution of an OoB EUV radiation may be acquired. According to the graph, the light Lb reflected from the black boarder 15b and the light La reflected from the reticle mask 15c are mainly irradiated onto edge areas bb-ex and rm-ex of the nearby shot area other than the corresponding shot area that is to be exposed to the light of the shot. If a plurality of shot areas are adjacent to one another, edge areas of all of the plurality of shot areas are unnecessarily exposed to light as described with reference to FIGS. 9 through 10B. Therefore, the uniformity of a circuit pattern may be deteriorated. According to a method of measuring an exposure distribution of an OoB EUV radiation of the inventive concept, the exposure distribution of the OoB EUV radiation may be quantitatively analyzed to evaluate the effect of out-of-EUV band light. Also, a performance of an EUV scanner that minimizes the out-of-EUV band light may be inspected so as to effectively perform an exposure process.

As a general method of measuring an exposure amount of an OoB EUV radiation, a method of installing a spectrum analyzer on a stage, on which wafer is disposed, may be used to directly analyze bands of light irradiated onto the wafer. However, the volume of the spectrum analyzer may be great, and the bandwidth that may be analyzed by the spectrum analyzer may be limited. Therefore, it may be difficult to measure the spectrum of an exposure of an OoB EUV radiation all over the wafer. Also, a method of analyzing bands of light irradiated onto a wafer such as a method of directly checking a profile of a pattern transferred onto the wafer by using a scanning electron microscopy (SEM) or the like may be used. However, it may be difficult to quantitatively analyze an exposure amount of each point.

In comparison with this, according to a method of measuring an exposure distribution of an OoB EUV radiation according to certain aspects of the inventive concept, a direct wavelength analysis is not needed. Therefore, an inspection may be performed at a relatively high-speed, and an exposure intensity may be quantitatively measured all over a wafer.

Figure 15:
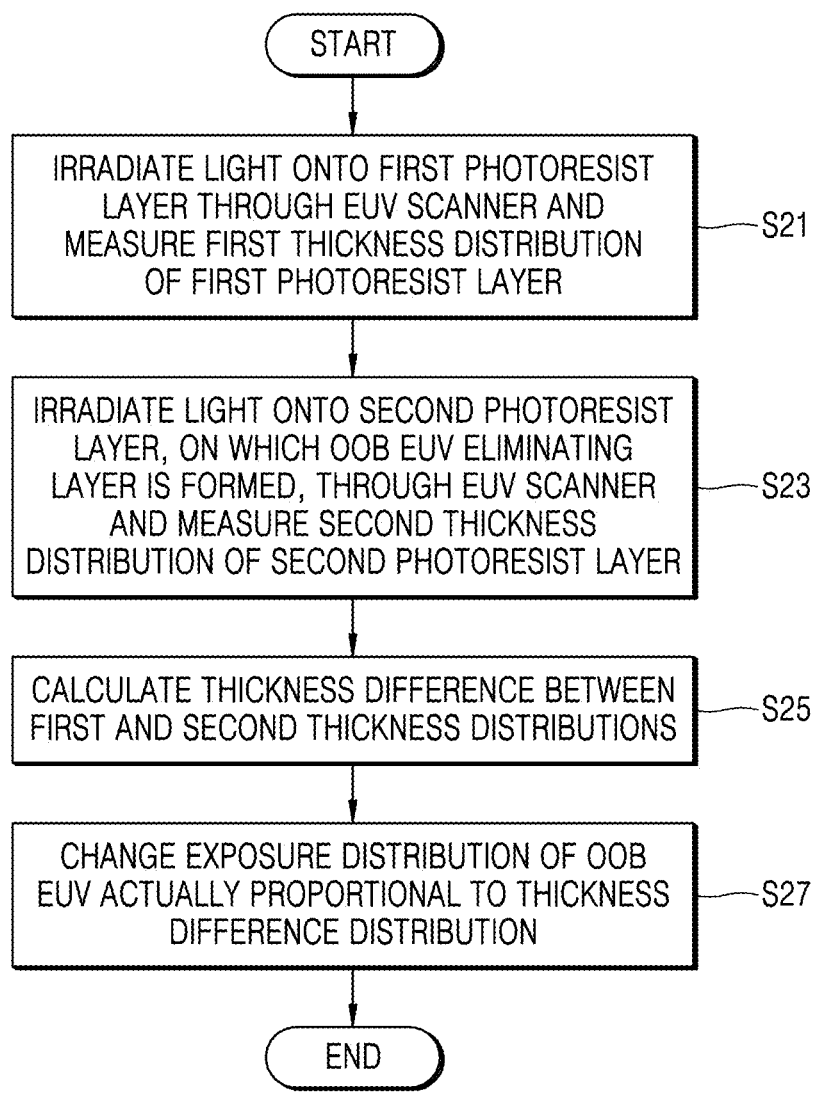
FIG. 15 is a flowchart illustrating a method of measuring an exposure distribution of an OoB EUV radiation according to certain embodiments of the inventive concept.

FIG. 15 is a flowchart illustrating a method of measuring an exposure distribution of an OoB EUV radiation according to an embodiment of the inventive concept. In the method of measuring the exposure distribution of the OoB EUV radiation described with reference to FIG. 1, the first and second exposure intensities are respectively changed or calculated from the first and second thickness distributions, and the first exposure intensity is eliminated from the second exposure intensity. However, in the method of measuring the exposure distribution of the OoB EUV radiation described with reference to FIG. 15, the thickness difference distribution may be calculated from the first and second thickness distributions, and then an exposure intensity is changed or calculated from the thickness difference by using a relation formula between the thickness and the exposure intensity.

Referring to FIG. 15, in operation S21, light is irradiated onto a first photoresist layer through an EUV scanner, and a first thickness distribution of the first photoresist layer is measured. In operation S23, light is irradiated onto a second photoresist layer on which an out-of-EUV band light eliminating layer is formed, and a second thickness distribution of the second photoresist layer is measured. Operations S21 and 23 may be performed by using one selected from a macro inspection device, an ellipsometer, and a leveling sensor. In operation S25, the thickness difference distribution between the first and second thickness distributions is calculated. In operation S27, an exposure intensity is changed or calculated from the thickness difference distribution to measure an exposure distribution of an OoB EUV radiation.

Figure 16:
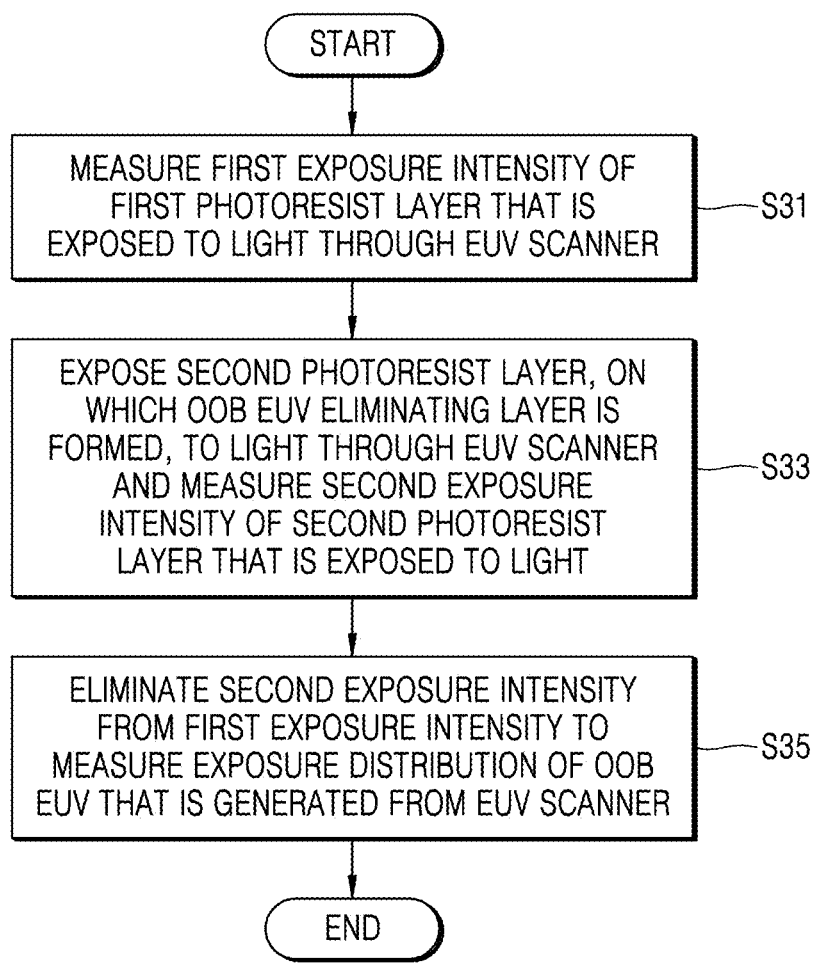
FIG. 16 is a flowchart illustrating a method of testing a performance of an EUV scanner according to certain embodiments of the inventive concept.

FIG. 16 is a flowchart illustrating a method of inspecting the performance of an EUV scanner according to an embodiment of the inventive concept. The method of FIG. 16 may use the method of measuring the exposure distribution of the OoB EUV radiation described with reference to FIG. 1.

Referring to FIG. 16, in operation S31, a first exposure intensity of a first photoresist layer that is exposed to light by an EUV scanner is measured. In operation S33, a second photoresist layer, on which an out-of-EUV band light eliminating layer is formed, is exposed to light by the EUV scanner, and a second exposure intensity of the second photoresist layer that is exposed to the light is measured. In operation S35, the second exposure intensity is eliminated from the first exposure intensity to measure an exposure distribution of an OoB EUV radiation generated by the EUV scanner. Therefore, an exposure amount out of the EUV band light generated from the EUV scanner may be measured, and the performance of the EUV scanner may be inspected.

Figure 17:
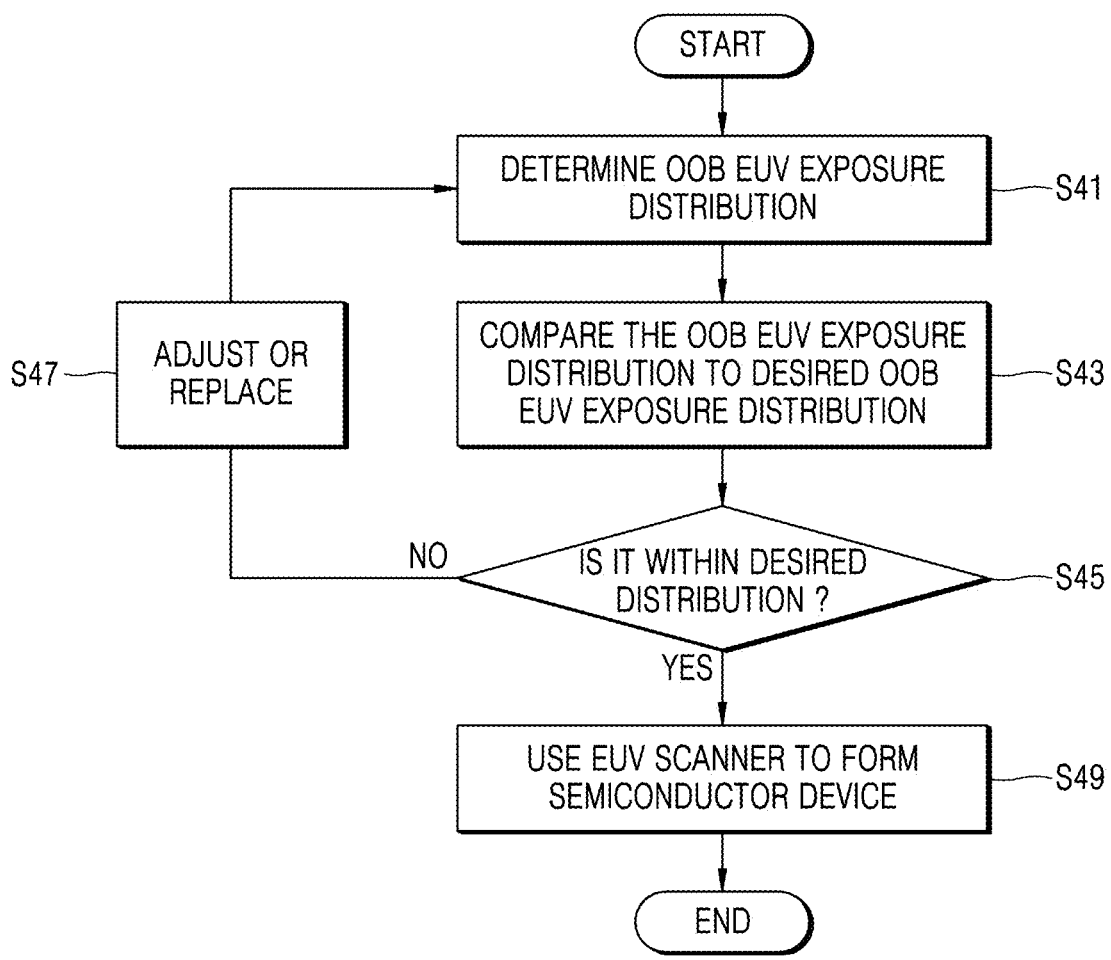
FIG. 17 is a flowchart illustrating a method of manufacturing a semiconductor device according to certain embodiments of the disclosure.

FIG. 17 is a flowchart illustrating a method of manufacturing a semiconductor device according to certain embodiments of the disclosure. The method may use one of the methods illustrated above in this disclosure. For example, the method may use the exposure distribution measuring method of OoB EUV radiation in FIG. 1 or FIG. 15, or the performance testing method of an EUV scanner in FIG. 16.

Referring to FIG. 17, in operation S41, an exposure distribution of an OoB EUV exposure may be determined by one of the methods described above. In operation S43, the exposure distribution determined in operation S41 is compared with a desired OoB EUV exposure distribution. The desired OoB EUV exposure distribution may be, for example, a specification of an EUV light source or an EUV scanner. For example, the desired OoB EUV exposure distribution may have a range of OoB EUV intensities at particular locations. In operation S45, it is determined whether the determined OoB EUV exposure distribution in operation S41 is within the range of the desired OoB EUV exposure distribution. If the determined OoB EUV exposure distribution is not within the desired OoB EUV exposure distribution, the EUV scanner may be adjusted, or a light source of the EUV scanner may be replaced in operation S47. After the operation S47, the measuring method of an OoB EUV exposure distribution may be performed again to determine whether the OoB EUV exposure distribution is within the desired OoB EUV exposure distribution. In operation S45, if the OoB EUV exposure distribution is within the desired OoB EUV exposure distribution, operation S49 is performed without performing the operation S47. In operation S49, the EUV light source or the EUV scanner is used to manufacture a semiconductor device. For example, in operation S49, a photoresist layer formed on a substrate may be exposed by the EUV scanner to form a photoresist pattern on the substrate. For example, the substrate may be a semiconductor substrate, such as a silicon wafer or a germanium wafer, and the photoresist pattern may be used as a mask patterning the substrate itself or a layer on it. Based on the patterning and one or more other processes, a semiconductor device such as an integrated circuit semiconductor chip may be formed.

While various aspects of the inventive concept have been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:

irradiating a first photoresist layer with light via an EUV scanner;

developing the first photoresist layer to form a first photoresist pattern;

measuring thicknesses of the first photoresist pattern;

converting the thicknesses of the first photoresist pattern into a first exposure intensity distribution of the first photoresist layer;

irradiating a second photoresist layer, on which an OoB EUV light eliminating layer is formed, with light via the EUV scanner;

developing the second photoresist layer to from a second photoresist pattern;

measuring thicknesses of the second photoresist pattern;

converting the thicknesses of the second photoresist pattern into a second exposure intensity distribution of the second photoresist layer;

subtracting the second exposure intensity distribution from the first exposure intensity distribution;

based on a result of the subtraction, determining an exposure distribution of an OoB EUV radiation that is generated by the EUV scanner;

based on the determining, adjusting or determining passing of the EUV scanner or a part of the EUV scanner;

after the adjusting or determining passing, exposing a photoresist layer formed on a substrate using the EUV scanner; and patterning the photoresist layer.

2. The method of claim 1, wherein the first and second exposure intensities are determined by corresponding thicknesses of the first and second photoresist layers after the first and second photoresist layers are developed to remove portions of the first and second photoresist layers.

3. The method of claim 2, wherein the measurement of the thicknesses is performed by a macro inspection device, an ellipsometer, or a leveling sensor.

4. A method of manufacturing a semiconductor device, the method comprising:

irradiating a first photoresist layer via a light source;

measuring a first exposure intensity of the first photoresist layer;

irradiating a second photoresist layer via the light source;

measuring a second exposure intensity of the second photoresist layer;

subtracting the second exposure intensity from the first exposure intensity; and subsequent to the subtracting, exposing a third photoresist layer formed on a semiconductor substrate by using the light source, wherein an OoB EUV light eliminating layer is formed on the second photoresist layer.

5. The method of claim 4, wherein the measuring of the first and second exposure intensities comprises calculating the first and second exposure intensities based on thickness distributions of the first and second photoresist layers.

6. The method of claim 5, wherein each of the thickness distributions of the first and second photoresist layers is converted into an exposure intensity distribution according to a relationship between thicknesses and exposure intensities, and the relationship is determined by measuring various photoresist thicknesses varying by corresponding exposure amounts.

7. The method of claim 5, wherein each of the thickness distributions of the first and second photoresist layers is determined according to color intensities of the first and second photoresist layers measured via a macro inspection device, respectively.

8. The method of claim 7, wherein the color intensities are intensities of a color selected from red (R), green (G), or blue (B).

9. The method of claim 5, wherein each of the thickness distributions of the first and second photoresist layers is determined according to changes in polarization states of the first and second photoresist layers, wherein the changes in polarization states are measured via an ellipsometer before and after reflection of the first and second photoresist layers.

10. The method of claim 5, wherein each of the thickness distributions of the first and second photoresist layers is determined according to changes in heights of upper surfaces of the first and second photoresist layers measured via a leveling sensor.

11. The method of claim 4, wherein:

the measuring of the first and second exposure intensities comprises: converting the first and second exposure intensities at respective points of the first and second photoresist layers into numerical values; and the eliminating of the second exposure intensity from the first exposure intensity comprises: subtracting the numerical value of the second exposure intensity from the numerical value of the first exposure intensity of respective points, and calculating an exposure distribution of an OoB EUV radiation based on a numerical value resulting from the subtraction.

12. The method of claim 4, wherein the measuring of the first and second exposure intensities is performed with respect to one or more shot areas per wafer.

13. The method of claim 4, wherein the measuring of the first and second exposure intensities comprises: mapping or graphing the first and second exposure intensities.

14. The method of claim 4, further comprising measuring exposure distribution of OoB EUV radiation according to wavelength, wherein the measuring of the exposure distribution comprises performing optical tuning with respect to the OoB EUV light eliminating layer.

15. The method of claim 4, wherein the first and second photoresist layers are exposed to light generated from the light source, incident onto a reticle structure, and reflected from the reticle structure.

16. The method of claim 15, wherein the reticle structure comprises a circuit pattern area, a black border that supports an edge of the circuit pattern area, and a reticle mask that prevents predetermined areas from being irradiated with light.

17. The method of claim 16, wherein the measuring of the first and second exposure intensities comprises measuring exposure intensities of light reflected from the black border or exposure intensities of light reflected from the reticle mask.

18. A method of manufacturing a semiconductor device, the method comprising:

irradiating a first photoresist layer with light via an EUV scanner and measuring a first exposure intensity of the first photoresist layer;

irradiating a second photoresist layer, on which an OoB EUV light eliminating layer is formed, with light via the EUV scanner and measuring a second exposure intensity of the second photoresist layer;

subtracting the second exposure intensity from the first exposure intensity and determining, based on a result of the subtraction, an exposure distribution of an OoB EUV radiation that is generated by the EUV scanner;

based on the determining, adjusting or determining passing of the EUV scanner;

after the adjusting or determining passing, exposing a photoresist layer formed on a substrate using the EUV scanner; and patterning the photoresist layer.

19. The method of claim 18, wherein the first and second exposure intensities are measured by measuring corresponding thicknesses of the first and second photoresist layers after the first and second photoresist layers are developed to remove portions of the first and second photoresist layers.

20. The method of claim 19, wherein the measurement of the thicknesses is performed by a macro inspection device, an ellipsometer, or a leveling sensor.

* * * * *